(12) United States Patent
Conolly et al.

(10) Patent No.: US 11,426,969 B2
(45) Date of Patent: Aug. 30, 2022

(54) INSULATED RADIANT BARRIERS IN APPAREL

(71) Applicant: Xefco Pty Ltd, Northwood (AU)

(72) Inventors: Brian John Conolly, Northwood (AU); Thomas Kenneth Hussey, Balmain (AU)

(73) Assignee: Xefco Pty Ltd, Eveleigh (AU)

( * ) Notice: Subject to any disclaimer, the term of this patent is extended or adjusted under 35 U.S.C. 154(b) by 0 days.

(21) Appl. No.: 16/185,897

(22) Filed: Nov. 9, 2018

(65) Prior Publication Data
US 2019/0099984 A1 Apr. 4, 2019

Related U.S. Application Data

(63) Continuation of application No. 14/293,571, filed on Jun. 2, 2014, now Pat. No. 10,160,184.

(30) Foreign Application Priority Data

Jun. 3, 2013 (AU) .................................. 2013901987
Jul. 16, 2013 (AU) .................................. 2013902646

(51) Int. Cl.
*B32B 3/24* (2006.01)
*B32B 3/26* (2006.01)
(Continued)

(52) U.S. Cl.
CPC ............ *B32B 3/266* (2013.01); *A41D 31/065* (2019.02); *A41D 31/12* (2019.02); *B32B 3/30* (2013.01); *B32B 5/02* (2013.01); *B32B 5/022* (2013.01); *B32B 5/024* (2013.01); *B32B 5/026* (2013.01); *B32B 5/24* (2013.01); *B32B 5/26* (2013.01); *B32B 15/04* (2013.01); *B32B 15/08* (2013.01); *B32B 15/14* (2013.01); *B32B 18/00* (2013.01); *B32B 27/02* (2013.01); *B32B 27/06* (2013.01); *B32B 27/12* (2013.01); *B32B 33/00* (2013.01); *C23C 14/5826* (2013.01);
(Continued)

(58) Field of Classification Search
None
See application file for complete search history.

(56) References Cited

U.S. PATENT DOCUMENTS 3,707,433 A 12/1972 Clough et al.
4,136,222 A 1/1979 Jonnes
(Continued)

FOREIGN PATENT DOCUMENTS

DE 2252431 A1 * 5/1974
DE 9204832 U1 * 6/1992
(Continued)

OTHER PUBLICATIONS

Machine Translation of KR 20110069474 A, Jun. 2011 (Year: 2011).*
(Continued)

*Primary Examiner* — Jeffrey A Vonch
(74) *Attorney, Agent, or Firm* — Nixon & Vanderhye P.C.

(57) ABSTRACT

Fabrics made for apparel, tents, sleeping bags and the like, in various composites, constructed such that a combination of substrate layers and insulation layers is configured to provide improved thermal insulation. The fabric composites are constructed to form a radiant barrier against heat loss via radiation and via conduction from a body.

20 Claims, 6 Drawing Sheets

(51) Int. Cl.
| | |
|---|---|
| *B32B 3/30* | (2006.01) |
| *B32B 5/02* | (2006.01) |
| *B32B 5/26* | (2006.01) |
| *B32B 15/08* | (2006.01) |
| *B32B 15/14* | (2006.01) |
| *C23C 14/58* | (2006.01) |
| *B32B 15/04* | (2006.01) |
| *B32B 27/12* | (2006.01) |
| *B32B 5/24* | (2006.01) |
| *B32B 27/06* | (2006.01) |
| *B32B 27/02* | (2006.01) |
| *B32B 18/00* | (2006.01) |
| *B32B 33/00* | (2006.01) |
| *C23C 28/00* | (2006.01) |
| *A41D 31/06* | (2019.01) |
| *A41D 31/12* | (2019.01) |
| *A41D 31/02* | (2019.01) |
| *C23C 14/02* | (2006.01) |
| *C23C 14/24* | (2006.01) |
| *B32B 15/20* | (2006.01) |
| *B32B 5/04* | (2006.01) |
| *B32B 27/30* | (2006.01) |
| *C23C 8/10* | (2006.01) |
| *C23C 8/36* | (2006.01) |
| *C23C 14/20* | (2006.01) |
| *A41D 31/04* | (2019.01) |
| *A41D 31/08* | (2019.01) |
| *A41D 31/102* | (2019.01) |
| *A41D 31/14* | (2019.01) |
| *A41D 31/30* | (2019.01) |
| *A41D 31/18* | (2019.01) |

(52) U.S. Cl.
CPC ........ *C23C 14/5853* (2013.01); *C23C 28/321* (2013.01); *C23C 28/345* (2013.01); *A41D 31/04* (2019.02); *A41D 31/08* (2019.02); *A41D 31/102* (2019.02); *A41D 31/145* (2019.02); *A41D 31/185* (2019.02); *A41D 31/305* (2019.02); *A41D 2400/10* (2013.01); *A41D 2500/10* (2013.01); *A41D 2500/20* (2013.01); *A41D 2500/30* (2013.01); *A41D 2500/50* (2013.01); *A41D 2500/52* (2013.01); *A41D 2500/54* (2013.01); *B32B 5/04* (2013.01); *B32B 15/20* (2013.01); *B32B 27/308* (2013.01); *B32B 2250/05* (2013.01); *B32B 2250/40* (2013.01); *B32B 2255/02* (2013.01); *B32B 2255/10* (2013.01); *B32B 2255/20* (2013.01); *B32B 2255/205* (2013.01); *B32B 2255/26* (2013.01); *B32B 2255/28* (2013.01); *B32B 2262/0253* (2013.01); *B32B 2262/0261* (2013.01); *B32B 2262/0276* (2013.01); *B32B 2262/062* (2013.01); *B32B 2262/08* (2013.01); *B32B 2307/30* (2013.01); *B32B 2307/304* (2013.01); *B32B 2307/3065* (2013.01); *B32B 2307/416* (2013.01); *B32B 2307/50* (2013.01); *B32B 2307/7145* (2013.01); *B32B 2307/72* (2013.01); *B32B 2307/722* (2013.01); *B32B 2307/724* (2013.01); *B32B 2307/726* (2013.01); *B32B 2307/728* (2013.01); *B32B 2307/7265* (2013.01); *B32B 2307/73* (2013.01); *B32B 2307/752* (2013.01); *B32B 2307/762* (2013.01); *B32B 2307/764* (2013.01); *B32B 2311/00* (2013.01); *B32B 2311/04* (2013.01); *B32B 2311/08* (2013.01); *B32B 2311/16* (2013.01); *B32B 2311/18* (2013.01); *B32B 2311/24* (2013.01); *B32B 2311/30* (2013.01); *B32B 2315/02* (2013.01); *B32B 2437/00* (2013.01); *C23C 8/10* (2013.01); *C23C 8/36* (2013.01); *C23C 14/02* (2013.01); *C23C 14/20* (2013.01); *C23C 14/24* (2013.01); *Y10S 428/913* (2013.01); *Y10S 428/921* (2013.01); *Y10T 428/2481* (2015.01); *Y10T 428/24132* (2015.01); *Y10T 428/24331* (2015.01); *Y10T 428/24612* (2015.01); *Y10T 428/24818* (2015.01); *Y10T 428/24942* (2015.01); *Y10T 428/24967* (2015.01); *Y10T 428/249962* (2015.04); *Y10T 428/249964* (2015.04); *Y10T 428/265* (2015.01); *Y10T 428/31* (2015.01); *Y10T 442/2041* (2015.04); *Y10T 442/2098* (2015.04); *Y10T 442/2139* (2015.04); *Y10T 442/2164* (2015.04); *Y10T 442/2172* (2015.04); *Y10T 442/2189* (2015.04); *Y10T 442/2484* (2015.04); *Y10T 442/2525* (2015.04); *Y10T 442/2533* (2015.04); *Y10T 442/2541* (2015.04); *Y10T 442/2598* (2015.04); *Y10T 442/2713* (2015.04); *Y10T 442/2762* (2015.04); *Y10T 442/2861* (2015.04); *Y10T 442/30* (2015.04); *Y10T 442/3065* (2015.04); *Y10T 442/3325* (2015.04); *Y10T 442/3398* (2015.04); *Y10T 442/3407* (2015.04); *Y10T 442/3415* (2015.04); *Y10T 442/3423* (2015.04); *Y10T 442/3439* (2015.04); *Y10T 442/3537* (2015.04); *Y10T 442/3602* (2015.04); *Y10T 442/3707* (2015.04); *Y10T 442/3789* (2015.04); *Y10T 442/3829* (2015.04); *Y10T 442/40* (2015.04); *Y10T 442/425* (2015.04); *Y10T 442/469* (2015.04); *Y10T 442/481* (2015.04); *Y10T 442/494* (2015.04); *Y10T 442/60* (2015.04); *Y10T 442/614* (2015.04); *Y10T 442/647* (2015.04); *Y10T 442/656* (2015.04); *Y10T 442/657* (2015.04); *Y10T 442/659* (2015.04); *Y10T 442/674* (2015.04)

(56) References Cited

U.S. PATENT DOCUMENTS

| | | |
|---|---|---|
| 4,525,406 A | 6/1985 | Pollock |
| 4,560,608 A | 12/1985 | Pusch et al. |
| 4,685,155 A | 8/1987 | Fingerhut et al. |
| 4,739,012 A | 4/1988 | Hagman |
| 4,842,893 A | 6/1989 | Yializis et al. |
| 4,868,062 A | 9/1989 | Hoeschele et al. |
| 4,954,371 A | 9/1990 | Yializis |
| 5,032,461 A | 7/1991 | Shaw et al. |
| 5,238,618 A | 8/1993 | Kinzer |
| 5,285,542 A * | 2/1994 | West .................... A47C 27/007 5/500 |
| 5,547,508 A | 8/1996 | Affinito |
| 5,955,175 A | 9/1999 | Culler |
| 5,958,115 A | 9/1999 | Bottcher et al. |
| 5,978,133 A | 11/1999 | Gillich |
| 6,066,826 A | 5/2000 | Yializis |
| 6,083,628 A | 7/2000 | Yializis |
| 6,112,328 A | 9/2000 | Spector |
| 6,129,879 A * | 10/2000 | Bersted .................. D02G 3/445 264/211.14 |
| 6,270,841 B1 | 8/2001 | Mikhael et al. |
| 6,358,570 B1 | 3/2002 | Affinito |
| 6,468,595 B1 | 10/2002 | Mikhael et al. |
| 6,599,850 B1 | 7/2003 | Heifetz |
| 6,800,573 B2 * | 10/2004 | Van De Ven ......... C23C 14/022 427/124 |
| 6,824,819 B2 | 11/2004 | Vogt et al. |

(56) References Cited

U.S. PATENT DOCUMENTS

| | | | |
|---|---|---|---|
| 7,013,496 B2 | 3/2006 | Dunn | |
| 7,157,117 B2 | 1/2007 | Mikhael et al. | |
| 7,805,907 B2 | 10/2010 | Bletsos et al. | |
| 2003/0027476 A1* | 2/2003 | Vogt | D06N 3/14 442/380 |
| 2004/0213918 A1* | 10/2004 | Mikhael | B05D 1/60 427/446 |
| 2006/0024228 A1 | 2/2006 | Liang et al. | |
| 2006/0040091 A1* | 2/2006 | Bletsos | C23C 14/562 428/137 |
| 2006/0099431 A1* | 5/2006 | Scholz | G02B 5/085 428/480 |
| 2006/0252333 A1* | 11/2006 | King | B32B 3/08 428/458 |
| 2006/0265814 A1 | 11/2006 | Ritter | |
| 2007/0037465 A1* | 2/2007 | Nutz | C23C 28/345 442/376 |
| 2007/0161310 A1* | 7/2007 | Shope | B32B 7/02 442/181 |
| 2007/0166528 A1* | 7/2007 | Barnes | B05D 7/02 428/304.4 |
| 2007/0245448 A1* | 10/2007 | Bury | A41D 3/00 2/108 |
| 2008/0095998 A1* | 4/2008 | Thiriot | A41D 31/085 428/219 |
| 2009/0019624 A1* | 1/2009 | Birk | D02G 3/04 2/81 |
| 2009/0188091 A1* | 7/2009 | Van Kerrebrouck | D04H 1/60 28/112 |
| 2010/0003877 A1* | 1/2010 | Fan | B32B 7/12 427/532 |
| 2010/0247855 A1* | 9/2010 | Bletsos | C23C 14/20 428/209 |
| 2010/0282433 A1* | 11/2010 | Blackford | A41D 31/065 165/46 |
| 2011/0041230 A1* | 2/2011 | Huang | A41D 31/065 2/69 |
| 2011/0203028 A1* | 8/2011 | Orologio | A41D 31/065 2/243.1 |
| 2011/0214221 A1* | 9/2011 | Munda | A41D 19/00 2/161.1 |
| 2011/0262699 A1 | 10/2011 | Yializis et al. | |
| 2013/0177731 A1* | 7/2013 | Moriarty | B32B 27/12 428/74 |
| 2015/0072113 A1* | 3/2015 | Terrell | B32B 37/0076 442/379 |
| 2015/0366281 A1* | 12/2015 | Miller | B32B 5/022 428/137 |

FOREIGN PATENT DOCUMENTS

| | | | | |
|---|---|---|---|---|
| DE | 10343308 | A1 | | 4/2005 |
| DE | 102007003136 | A1 * | 7/2008 | E04B 1/78 |
| EP | 0600844 | A1 * | 6/1994 | D04H 1/42 |
| FR | 1558444 | A * | 2/1969 | A43B 5/0486 |
| FR | 2581158 | A1 * | 10/1986 | A41D 31/02 |
| GB | 1272249 | A * | 4/1972 | A41D 27/02 |
| GB | 2207884 | A * | 2/1989 | A41D 31/02 |
| GB | 2411621 | A | | 9/2005 |
| GB | 2414960 | A * | 12/2005 | A41D 31/0038 |
| GB | 2448469 | A | | 10/2008 |
| JP | 60246804 | A * | 12/1985 | A41D 31/02 |
| JP | 61133508 | U * | 8/1986 | A41D 31/02 |
| JP | 62250280 | A * | 10/1987 | A41D 31/02 |
| JP | 02061921 | U * | 5/1990 | A41D 31/02 |
| JP | 05287533 | A * | 11/1993 | A41D 31/02 |
| JP | 06312692 | A * | 11/1994 | |
| JP | 07090704 | A * | 4/1995 | A41D 31/0038 |
| JP | 07037634 | U * | 7/1995 | |
| JP | 07279038 | A * | 10/1995 | A41D 31/0038 |
| JP | 10266068 | A * | 10/1998 | |
| JP | 2001115252 | A * | 4/2001 | |
| JP | 2001254275 | A * | 9/2001 | A41D 31/0038 |
| JP | 2002020944 | A * | 1/2002 | |
| JP | 2004338169 | A * | 12/2004 | A41D 27/02 |
| JP | 2006205366 | A * | 8/2006 | A41D 13/02 |
| JP | 2010037681 | A * | 2/2010 | |
| KR | 20110069474 | A * | 6/2011 | |
| RU | 2234563 | C1 * | 8/2004 | |
| WO | 9818852 | A1 | | 5/1998 |
| WO | 9958757 | A1 | | 11/1999 |
| WO | 9959185 | A1 | | 11/1999 |
| WO | 2005005698 | A1 | | 1/2005 |
| WO | 2009126979 | A1 | | 10/2009 |
| WO | WO-2010025783 | A1 * | 3/2010 | A41D 13/02 |
| WO | 2011063472 | A1 | | 6/2011 |
| WO | 2012073093 | A | | 6/2012 |
| WO | 2013030658 | A1 | | 3/2013 |

OTHER PUBLICATIONS

Machine Translation of JP-2002020944-A, Jan. 2002 (Year: 2002).*
Machine Translation of DE-102007003136-A1, Jul. 2008 (Year: 2008).*
Machine Translation of JP-2010037681-A, Feb. 2010 (Year: 2010).*
Machine Translation of RU-2234563-C1, Apr. 1972 (Year: 1972).*
Machine Translation of DE-9204832-U1, Jun. 1992 (Year: 1992).*
Senic et al., Application of TiO2 Nanoparticles for Obtaining Self-Decontaminating Smart Textiles, Jan. 2011, Science Technical Review, vol. 61, No. 3-4, pp. 63-72. (Year: 2011).
"Thermal Conductivity of Materials and Gases." Engineeringtoolbox. com. N.p. Web. Apr. 19, 2016. <http://www.engineeringtoolbox.com/>.
U.S. Office Action U.S. Appl. No. 14/293,571 dated Jan. 25, 2018 36 pages.
U.S. Office Action U.S. Appl. No. 14/293,571 dated Mar. 13, 2017 34 pages.
U.S. Office Action U.S. Appl. No. 14/293,571 dated Mar. 22, 2016 19 Pages.
U.S. Office Action U.S. Appl. No. 13/768,912 dated Jun. 13, 2017 14 Pages.
U.S. Office Action U.S. Appl. No. 14/789,383 dated Jul. 15, 2016 13 Pages.
U.S. Office Action U.S. Appl. No. 14/789,383 dated Oct. 31, 2016 12 Pages.
U.S. Office Action U.S. Appl. No. 14/293,571 dated Nov. 21, 2016 27 Pages.
U.S. Office Action U.S. Appl. No. 13/768,912 dated Dec. 5, 2016 10 Pages.
U.S. Office Action U.S. Appl. No. 14/293,571 dated Jul. 31, 2017 pp. 38.
U.S. Office Action U.S. Appl. No. 14/789,383 dated Aug. 10, 2017 pp. 15.

* cited by examiner

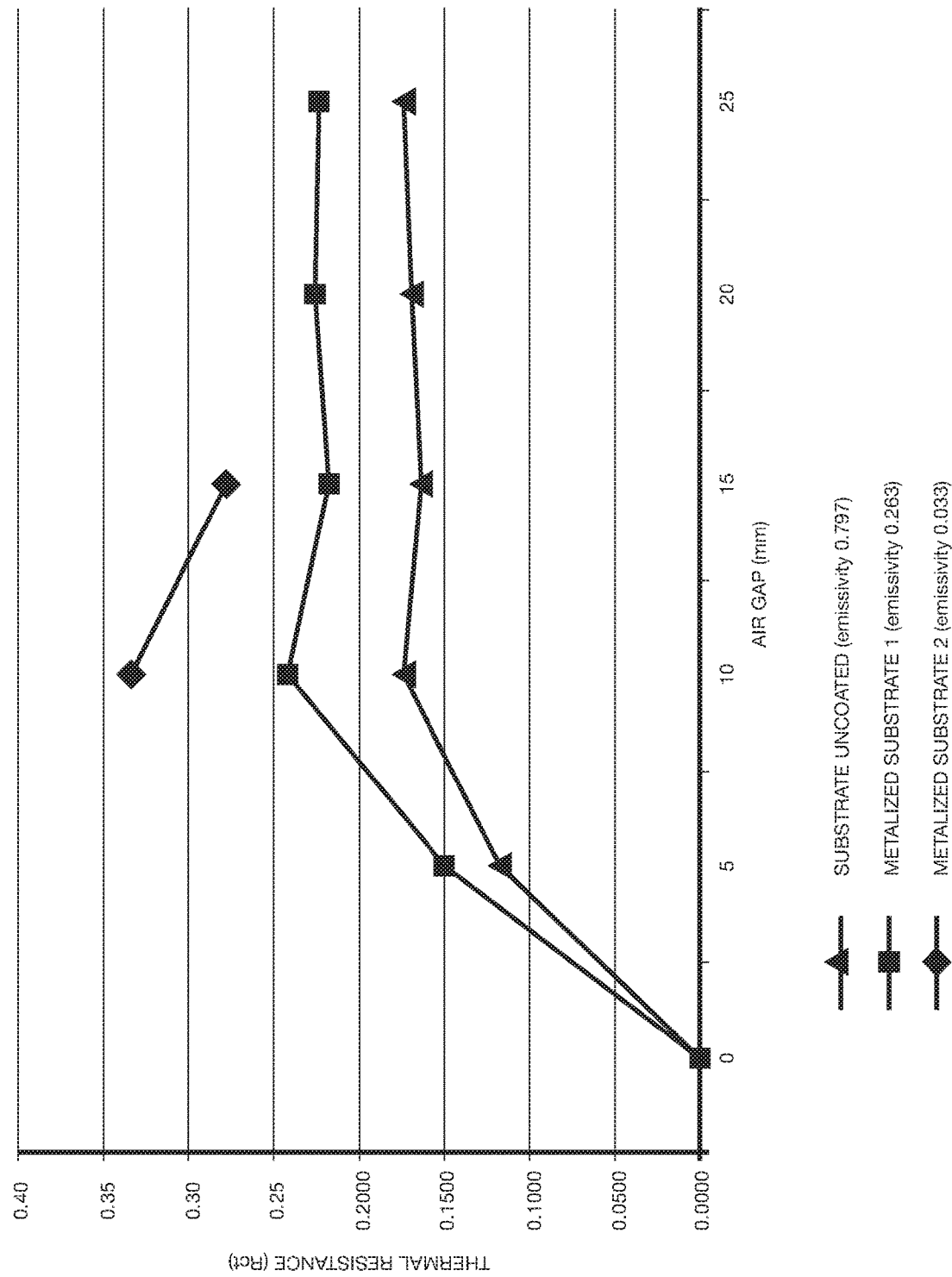

INSULATED RADIANT BARRIERS IN APPAREL

CROSS-REFERENCE TO RELATED APPLICATIONS

This application is a continuation of U.S. patent application Ser. No. 14/293,571, filed Jun. 2, 2014, which claims priority from Australian Patent Application Nos. 2013901987, filed on Jun. 3, 2013, and 2013902646, filed on Jul. 16, 2013. All prior applications are herein incorporated by reference in their entirety.

TECHNICAL FIELD

The present invention relates to fabrics made for apparel, tents, sleeping bags and the like, in various composites, constructed such that a combination of substrate layers and insulation layers is configured to provide improved thermal insulation.

BACKGROUND

In the present invention the use of metallization to create infrared reflecting barriers is adopted for clothing or outdoor equipment such as sleeping bags or tents. These radiant barriers, require careful insulation from heat loss via conduction.

Corrosion, particularly in salty environments, of these metal layers through oxidisation can be considerable and methods known in the art are adopted to help prevent oxidisation.

When a moisture vapor permeable substrate is coated over substantially an entire surface using conventional methods such as air knife coating, flexographic printing, gravure coating, etc., the coating reduces the moisture vapor permeability of the substrate. If the starting substrate has an open structure and is highly air permeable, the substrate can retain sufficient moisture vapor permeability after coating to be useful in certain end uses, such as apparel. For example, fabrics described in U.S. Pat. No. 5,955,175 to Culler are both air permeable and moisture vapor permeable after being metalized and coated with an oleophobic coating.

When the starting moisture vapor permeable substrate is a non-porous monolithic membrane, conventional coatings result in significant covering of the surface of the substrate. This results in a coated substrate having significantly lower moisture vapor permeability than the starting substrate. This is undesirable in apparel or outdoor equipment products, which are desirably permeable to moisture vapor while at the same time forming a barrier to infiltration by air and water. As described by Sympatex in U.S. Pat. No. 6,800,573 it is possible to coat these non-porous vapour permeable substrates using a plasma treated vapour deposition metalization process and maintain good vapour permeability.

US Patent Application Publication US 2004/0213918 A1 (Mikhael et al.) discloses a process for functionalizing a porous substrate, such as a nonwoven fabric or paper, with a layer of polymer, and optionally a layer of metal or ceramic. According to one embodiment, the process includes the steps of flash evaporating a monomer having a desired functionality in a vacuum chamber to produce a vapor, condensing the vapor on the porous substrate to produce a film of the monomer on the porous substrate, curing the film to produce a functionalized polymeric layer on the porous substrate, vacuum depositing an inorganic layer over the polymer layer, and flash evaporating and condensing a second film of monomer on the inorganic layer and curing the second film to produce a second polymeric layer on the inorganic layer. Mikhael et al. also discloses another embodiment including the steps of flash evaporating and condensing a first film of monomer on the porous substrate to produce a first film of the monomer on the porous substrate, curing the film to produce a functionalized polymeric layer on the porous substrate, vacuum depositing a metal layer over the polymer layer, and flash evaporating and condensing a second film of monomer on the metal layer and curing the second film to produce a second polymeric layer on the metal layer.

US Patent Applications US 2007/0166528 A1 (Barnes et al.) discloses a process for oxidising the surface of a metal coating with an oxygen-containing plasma to form a synthetic metal oxide coating, making a superior resistance to corrosion of the metallized porous sheet.

Methods for both improving the moisture vapour permeability of the composite and insulating the metal layer from conduction are disclosed in the present invention.

SUMMARY

A first embodiment of the present invention relates to fabrics made for apparel, in various composites, and are constructed such that there is at least one metal layer, forming a radiant barrier for heat loss via radiation from the human body and at least one insulating layer protecting the said metal layer from heat loss via conduction.

In a preferred embodiment of the present invention the said metal layer is adjacent to at least one insulation layer designed to help insulate the metal layer from heat loss via conduction, while maintaining low emissivity and optimising the infrared reflectance. The said insulating layer can be optimised to maintaining good infrared reflectance of said metal layer, preferably within the range primarily radiated by the human body, which is dominant in the 12 micrometer wavelength and typically in the infrared spectrum between 7 micrometer and 14 micrometers. Said insulating material could be a natural or synthetic feather, down, or fibre insulation.

In a preferred embodiment of the present invention, the said metal layer is applied to a woven, knitted or non woven substrate that has been produced via the process of vapour deposition in a vacuum. In another preferred embodiment of the present invention, said metal layer is applied to a moisture vapour permeable substrate formed of a film, textile, or textile and film composite. In other embodiments, the metal layer is applied to a moisture vapour permeable and substantially liquid impermeable substrate formed of a film, textile, or textile and film composite.

In a further aspect of the present invention, additional organic and inorganic coating layers may be deposited before or after said metal layer in order to improve adhesion to said substrate and/or prevent corrosion and/or achieve a lower emissivity by creating a smoother reflective surface. In addition the metal layer can have increased corrosion resistance by oxidising the surface of a metal coating with an oxygen-containing plasma to form a self protective metal oxide coating.

Functionalization of the various coatings can also be optionally included, and alternative embodiments of the present invention may also have extra material layers in the composite. Any layer may be coated for functionalization, preferably during the same plasma treated vacuum vapour deposition process, and preferably via vapour deposition utilising flash evaporation, to be flame retardant, UV absorbing, self cleaning, hydrophobic, hydrophilic, or antibacterial.

In another preferred embodiment of the present invention, said metal layer may be produced by means of coating the substrate with a thin metallic film by means of sputtering, rotary screen printing, block screen printing, transfer printing, jet printing, spraying, sculptured roller or other methods. In an alternative embodiment, said metal layer is applied to said substrate by means of transfer metallization whereby a thin metal film or foil is coated onto a release substrate via vacuum vapour deposition or other method and then adhered onto said substrate.

An alternative embodiment of the present invention relates to fabrics made for apparel, in various composites, and are constructed such that there is a first substrate and first insulation layer adjacent to the first surface of said substrate and a second insulation layer adjacent to the second layer of said substrate. Whereby the said substrate layer positioned between the two insulation layers provides improved thermal resistance of the total composite.

BRIEF DESCRIPTION OF THE DRAWINGS

FIGS. 3A and 3B are graphs showing testing data of composites comprising insulation layers and/or substrates and/or radiant barrier layers.

DETAILED DESCRIPTION

As used herein, the term "metal" includes metal alloys as well as metals.

The inclusion of a metallized radiant barrier into a garment requires insulation of the radiant barrier to conduction in order for the radiant barrier to provide improved thermal resistance. Said insulation layer is preferably provided by use of an insulated gap adjacent to the radiant barrier, thereby providing good thermal insulation whilst also maintaining good exposure of the radiant barrier to reflect infrared radiation.

One aspect of the present invention relates to an infra-red reflective, moisture vapour permeable composite formed by coating at least one side of a moisture vapour permeable substrate with at least one metal layer and combining this said metal layer with at least one insulating layer.

Figure 1A:
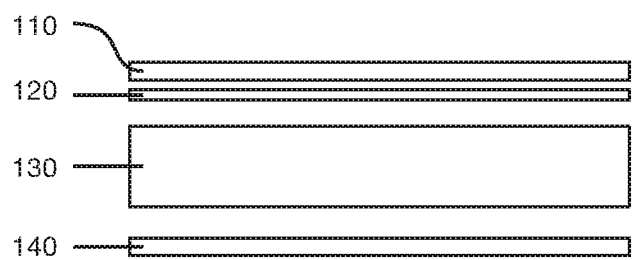
FIGS. 1A, 1B, 2A, 2B, 2C, 2D, 2E, and 2F are schematic diagrams showing various embodiments of the present invention, including layering combinations of substrates, metal layers and insulating layers.
Figure 1B:
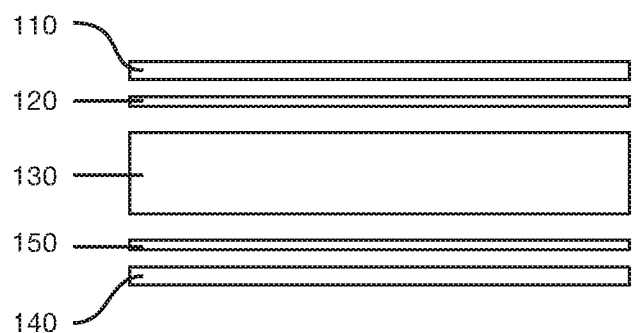

A preferred embodiment of the present invention shown in FIG. 1A features substrate 110 coated with metal layer 120, insulation layer 130 adjacent to said metal layer and additional substrate 140 adjacent to opposing surface of insulating layer to said metal layer. In an alternative embodiment shown in FIG. 1B, a second metal layer 150 is coated on substrate 140 on the surface adjacent to said insulating layer.

According to a particular embodiment of the invention as shown in FIG. 1A, the substrate 110 is a woven textile, stretch woven textile, and/or composite with moisture vapour permeable and substantially liquid impermeable film or coating. The metal layer 120 is applied to the substrate.

The insulation 130 is about 5 mm thick with an emissivity between about 0.3 and about 1. The insulation layer 130 has other thicknesses and emissivities in other embodiments, such as an emissivity between about 0.3 and about 0.4. The substrate 140 is a woven textile, stretch woven textile or knitted textile.

Figure 2A:
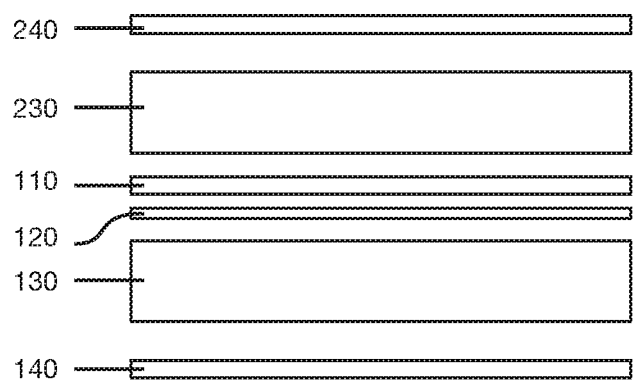

FIG. 2A shows a particularly advantageous embodiment of the present invention. Substrate 110 is disposed between first insulation layer 130 and second insulation layer 230. In this embodiment, each of the substrate 110, first insulation layer 130 and second insulation layer 230 are moisture vapour permeable so that the entire composite is moisture vapour permeable. Substrate 110 is a film, textile, or film composite and the insulation layers 130 and 230 are formed of natural or synthetic feather or fibre insulation. In this embodiment, layers 140 and 240 shown in the figure are not used.

Another preferred embodiment of the present invention is shown in FIG. 2A and features substrate 110 coated with metal layer 120, insulation layer 130 adjacent to said metal layer and additional substrate 140 adjacent to the opposing surface of insulating layer 130 to said metal layer. An additional insulating layer 230 is adjacent to the opposite surface of substrate 110 to the said metal layer and additional substrate layer 240 is adjacent to the opposing surface of insulating layer 230 to substrate 110. Said insulation layer 230 provides additional insulation to conduction of said metal layer 120. In other embodiments, additional metal layers are added to the substrate layers to further increase the thermal resistance of said composite.

At least one of the first insulation layer 130 and the second insulation layer 230 is selected to have a thermal resistance between about 0.05 and about 0.5 $m^2K/W$. In some embodiments, both insulation layers have a thermal resistance in this range. The type, density, and thickness of insulation material used for these layers is controlled to arrive at the desired thermal resistance. The composition and design of the metal layer 120 is varied to obtain a thermal resistance between 0.0 and about 0.03 $m^2K/W$.

According to a particular embodiment of the invention as shown in FIG. 2A, the substrate 110 is a woven textile, stretch woven textile, and/or composite with moisture vapour permeable and substantially liquid impermeable film or coating. The metal layer 120 is applied to the substrate. The insulation 130 is about 5 mm thick with an emissivity between about 0.3 and about 1. The insulation layer 230 is about 5 mm thick with an emissivity between about 0.05 and about 0.5. The insulation layers 130 and 230 have other thicknesses and emissivities in other embodiments, such as an emissivity between about 0.3 and about 0.4. The substrate 140 is a woven textile, stretch woven textile or knitted textile. The substrate 240 is a woven textile, stretch woven textile, and/or composite with moisture vapour permeable and substantially liquid impermeable film or coating.

Figure 2B:
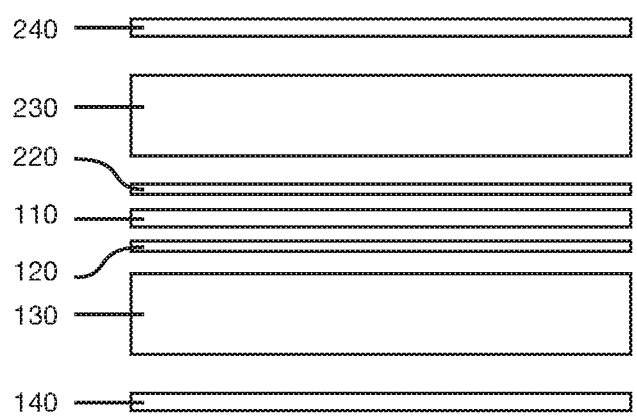

In another embodiment shown in FIG. 2B, a second metal layer 220 is coated on substrate 110 on the surface opposite to metal layer 120. In yet another embodiment shown in FIG. 2C, a second metal layer 250 is coated on substrate 240 on the surface adjacent to insulating layer 230. In another embodiment shown in FIG. 2D, a second metal layer 220 is coated on substrate 110 on the surface opposite to metal layer 120, a third metal layer 250 is coated on substrate 240 on the surface adjacent to insulating layer 230 and a fourth metal layer 150 is coated on substrate 140 of the surface adjacent to insulating layer 130.

Figure 2C:
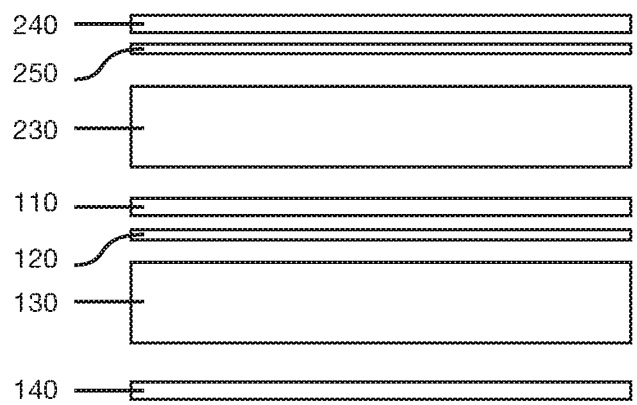
Figure 2D:
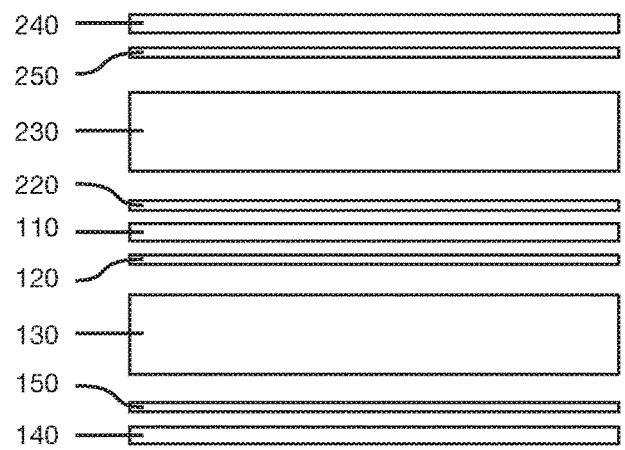

According to a particular embodiment of the invention as shown in FIG. 2C, the substrate 110 is a woven textile, stretch woven textile, and/or composite with moisture vapour permeable and substantially liquid impermeable film or coating. The metal layer 120 is applied to the substrate 110. The insulation 130 is about 5 mm thick with an emissivity between about 0.3 and about 1. The insulation layer 230 is about 5 mm thick with an emissivity between about 0.3 and about 1. The insulation layers 130 and 230 have other thicknesses and emissivities in other embodiments, such as an emissivity between about 0.3 and about 0.4. The substrate 140 is a woven textile, stretch woven textile or knitted textile. The substrate 240 is a woven textile, stretch woven textile, and/or composite with moisture vapour permeable and substantially liquid impermeable film or coating. Metal layer 250 is applied to the substrate 240.

Figure 2E:
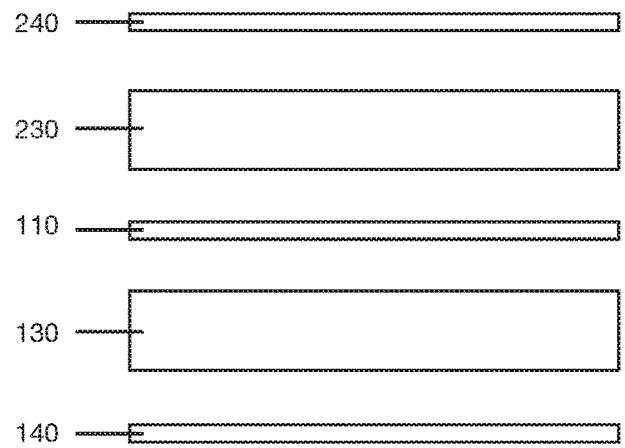

In a further aspect of the present invention shown in FIG. 2E, said composite is provided with 2 insulation layers 130 and 230 with inner substrate 110 and outer substrates 140 and 240. Said composite has been shown to provide improved thermal resistance compared to the same composite without inner substrate layer 110 by reducing heat loss due to convection.

In another aspect of the present invention, embodiments shown in FIGS. 1A, 1B, 2A, 2B, 2C, 2D, 2E, or 2F could be inversed as to produce layers in the opposite configuration of those described.

Figure 2F:
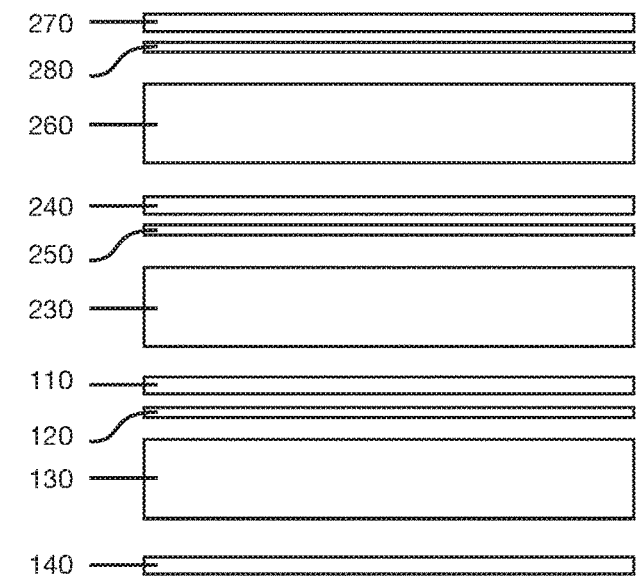

FIG. 2F shows an embodiment of the present invention that utilizes a third insulation layer 260. This embodiment includes a first substrate 110 with a metal layer 120 disposed thereon. A first insulation layer 130 is disposed on the metal layer 120, and a second substrate—intended to face the heat source, such as the body of the wearer—is disposed on the surface of the first insulation layer 130 opposite to the metal layer. A second insulation layer 230 is disposed on the side of the first substrate 110 opposite of the metal layer 120. The second insulation layer 230 is disposed on second metal layer 250 which is itself disposed on the third substrate 240. The third insulation layer 260 is disposed on the third substrate 240 opposite second metal layer 250. Finally, fourth substrate 270, which has third metal layer 280 disposed thereon, is disposed on the surface of third insulation layer 260 opposite third substrate 240.

According to a particular embodiment of the invention as shown in FIG. 2F, the substrate 110 is a woven textile, stretch woven textile, and/or composite with moisture vapour permeable and substantially liquid impermeable film or coating. The metal layer 120 is applied to the substrate 110. The insulation 130 is about 5 mm thick with an emissivity between about 0.3 and about 1. The insulation layer 230 is about 5 mm thick with an emissivity between about 0.3 and about 1. The substrate 140 is a woven textile, stretch woven textile or knitted textile. The substrate 240 is a woven textile, stretch woven textile, and/or composite with moisture vapour permeable and substantially liquid impermeable film or coating. Metal layer 250 is applied to the substrate 240. The insulation layer 260 is about 5 mm thick with an emissivity between about 0.3 and about 1. The insulation layers 130, 230, and 260 have other thicknesses and emissivities in other embodiments, such as an emissivity between about 0.3 and about 0.4. The substrate 270 is a woven textile, stretch woven textile, and/or composite with moisture vapour permeable and substantially liquid impermeable film or coating. Metal layer 280 is applied to the substrate 270.

The present invention provides an insulation layer adjacent to said metal layer in order to provide a substantially open area adjacent to the radiant barrier that provides structural support to maintain a consistent air gap between the heat source and radiant barrier. Said insulation layer is preferably a natural or synthetic fiber based insulation with good resistance to compression. The thickness and density of said insulation layer should be optimized to provide insulation to conduction to the radiant barrier whilst allowing reflection of infra-red radiation by the radiant barrier.

FIG. 3A shows the thermal resistance (Rct) of a metalized substrate with an emissivity of 0.236 compared with a substrate without metallization with emissivity 0.797 at air gap spacings of 0 mm, 5 mm, 10 mm, 15 mm, 20 mm and 25 mm. With an air gap of 0 mm no benefit is provided through the addition of the metallized layer as no insulation to conduction is provided. The optimal air gap size to enhance thermal resistance was shown to be 10 mm with an Rct of 0.240 $m^2K/W$, which is 36% higher than the substrate with no metallization. When a substrate with a metallized coating of lower emissivity 0.033 was tested at 10 mm air gap, an improvement in Rct of 90% was observed compared to the substrate with no metallization.

Figure 3B:
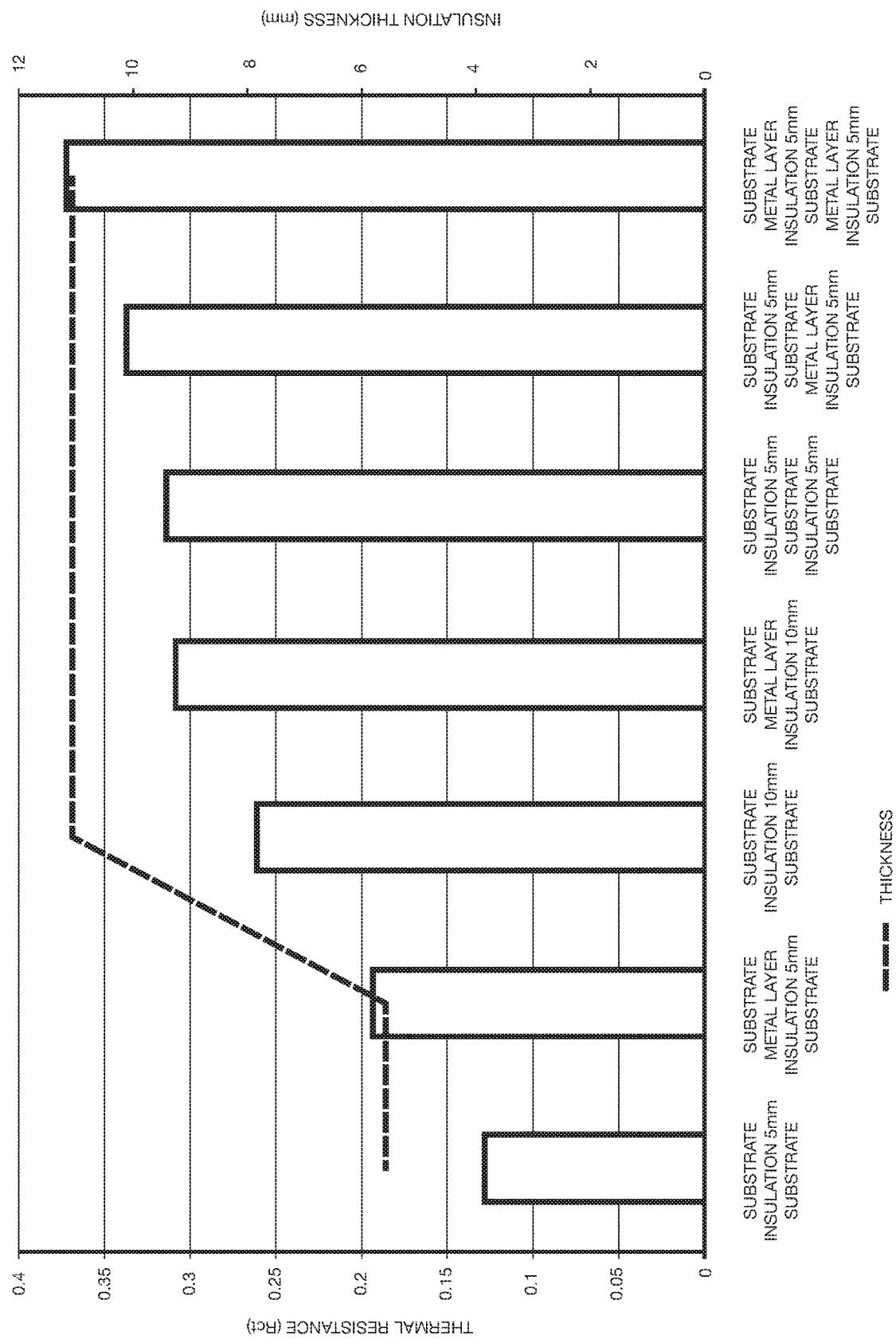

FIG. 3B shows the thermal resistance (Rct) of a composite comprising 1 or more polyester fiber insulation layers combined with 2 or more moisture vapor permeable substrates with optional metallization in various configurations.

A composite comprising said polyester fiber insulation layer with thickness of approximately 5 mm and emissivity of around 0.35 and a moisture vapor permeable substrate adjacent to each outside surface of said insulation layer, an Rct measurement of 0.1281 $m^2K/W$ was measured. When the substrate on the surface of the insulation layer opposite to the heat source was replaced with a metallized substrate with emissivity 0.236 with metal layer facing the insulation an Rct of 0.1926 $m^2K/W$ was measured thereby giving an improvement of around 50%. When the insulation thickness was increased to around 10 mm an Rct of 0.2603 was measured for the composite without any metal layer and an Rct of 0.3074 $m^2K/W$ was measured for the composite with the metal layer thereby giving an increase in thermal resistance of 18%.

When additional insulation layers and/or substrate layers and/or metal layers are added, further increases in thermal resistance were observed. When an additional moisture permeable substrate layer was positioned between two 5 mm insulation layers, an Rct of 0.3130 $m^2K/W$ was measured giving an increase in thermal resistance of 20% compared to the composite without the middle substrate layer. When the middle substrate was metalized with metal layer facing the heat source an Rct of 0.336 $m^2K/W$ was measured. When both middle and outer substrate layers has metalized layers facing the heat source an Rct of 0.3715 $m^2K/W$ is measured thereby showing an improvement of thermal resistance of 42% compared to composite of same insulation thickness without any radiant barriers and 190% compared to the composite with 5 mm insulation without any radiant barrier.

In one aspect of the present invention said insulating layer consists of a material that has relatively low thermal conductivity as compared to said metal layer. Thermal conductivity is the reciprocal of thermal resistance. Said insulation layer preferably consists of natural or synthetic feathers or fibres whereby the size and density of said feathers or fibres are selected as to provide high thermal insulation to conduction. Said insulation layer(s) can be combined with said substrate(s) by the process of lamination using an adhesive, high frequency weld, or a melt film, or a melt fibre between surfaces or a stitching/needling process.

Figure 4A:
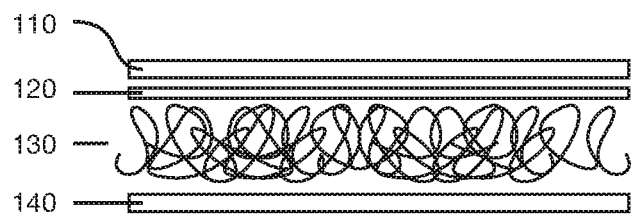
FIG. 4A shows an embodiment of the invention that includes a fiber based insulation layer.

In one aspect of the present invention, said insulation consists of synthetic fibres of between about 5 to about 20 micron in diameter and can consist of fibres that are all the same diameter or varying diameters. In another aspect of the present invention, said insulation may consist of a natural feather or down contained between two substrates whereby said substrates are of a knitted, non-woven or film that is able to resist the migration of said feathers through the said substrates. In one embodiment of the present invention, thickness and density of the fibres of at least one insulation layer is configured as to provide good infra red transparency, thus maintaining good infrared reflectance of the metal layer(s). FIG. 4A shows the use of a fibre insulation 130 adjacent to metal layer 120 whereby the spacing between the fibres of said insulation layer provide exposure of the metal layer through the insulation. In one embodiment, the density of fibres in insulation layer adjacent to the metal layer is selected such that the ratio of the volume of fibre in the insulation to the volume of air in the insulation is between 1:30 and 1:100. In other embodiments this ratio is within the range of 1:1-1:200. This provides exposure of the metal layer, or air gaps, that improve the infrared reflectance of the metal layer by improving the infrared transparency of the adjacent insulation.

Figure 4B:
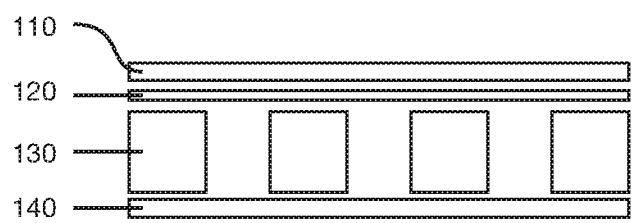
FIG. 4B shows an embodiment of the invention that includes a perforated insulation layer.
Figure 4C:
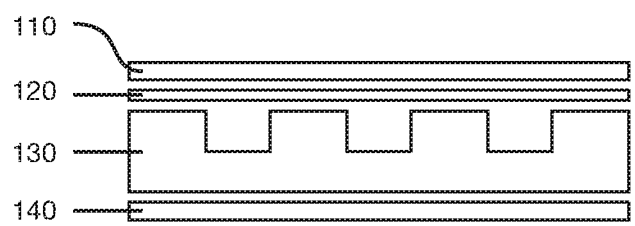
FIG. 4C shows an embodiment of the invention that includes an insulation layer with cavities.

In another embodiment of the present invention, at least one insulation layer is disposed in a pattern, density or texture such that a high percentage of the metal layer is still exposed through the air gaps of the said insulation layer, thus maintaining good infrared reflectance of the metal layer(s). FIG. 4B shows one preferred embodiment whereby said insulation layer is perforated to provide increased exposure of the said metal layer. Perforations may be provided in a regular or irregular pattern or produced by gaps between multiple sheets or segments of insulation. FIG. 4C show another preferred embodiment whereby said insulation layer is embossed or moulded to produce cavities adjacent to the metal layer thereby increasing exposure of said metal layer. The perforations and cavities are designed and/or selected such that at least 50% of the area of the surface of the metal layer on which the first insulation layer is disposed is not in direct contact with the insulation layer.

In another embodiment of the present invention, the thickness and density of the fibres of at least one insulation layer is configured so as to absorb infra red radiation.

In a preferred embodiment of the present invention the insulation layer adjacent to the metal layer(s) has an emissivity of between about 0.1 to about 1 and preferably, about 0.3 to about 1 to allow infrared radiation to pass through said insulation layer and be reflected back by the said metal layer. In embodiments that include two layers of insulation, it is advantageous for one or both layers to have an emissivity in the range of about 0.3 to about 1. More particularly, the emissivity of one or both layers is between about 0.3 and about 0.4. In one embodiment, the insulation layer adjacent to the metal layer is positioned closest to a heat source, such as a person's body, and the second insulation layer on the opposite side of the substrate bearing the metal layer. In this embodiment, the emissivity of the substrate is selected to be substantially higher than the emissivity of the second insulation layer. For example, the emissivity of the substrate is about 0.5 to about 1 while the emissivity of the second insulation layer is about 0.05 to about 0.5. Further, the insulation layer adjacent to the metal layer in such an embodiment would preferably have an emissivity of between about 0.3 and about 1, while the second insulation layer would have an emissivity of between about 0.05 and about 0.5.

In a preferred embodiment, said insulation layer 130 adjacent metal layer is between about 2 mm and about 10 mm thick to allow increased benefit of the addition of said metal layer with reduced overall composite thickness. A second insulation layer 230 adjacent to said substrate on the opposite side of said metal layer may be configured to have a very low emissivity to provide improved insulation to metal and substrate layers. In a preferred embodiment of the present invention, said insulation layer 130 is configured to provide very high resistance to compression to maintain the optimum thickness for high thermal insulation of the composite. The second insulation layer 230 can also have a thickness of between about 2 mm and about 10 mm.

In one aspect of the present invention, said substrate consists of a moisture vapour permeable non woven fabric, woven fabric, knitted fabric, moisture vapour permeable film or composites thereof, including Nylon, polyester, spandex, polypropylene, cotton, wool, or a mix of these materials. In another embodiment of the present invention, at least one textile fabric such as a woven, stretch woven, non-woven, or knitted fabric is applied to the substrate after coating with said organic and metal layers, where the said textile is combined with the substrate by process of lamination. Lamination can occur by using an adhesive, or a melt film, or a melt fibre between surfaces or a stitching/needling process.

In a further aspect of the present invention said substrate is comprised of a textile fabric such as a woven, stretch woven, non-woven, or knitted fabric that is combined with at least one moisture vapour permeable and substantially liquid impermeable coating and/or film lamination.

In a further aspect of the present invention, said substrate consists of a tightly woven textile consisting of fibres of between 5-80 denier as to allow a smooth surface to apply said metal layer and produce a low emissivity. Said textile could be produced from natural or synthetic fibres or blend thereof. In a preferred embodiment said textile is compressed through a series of hot rollers in a cire process before or after metalisation to produce a more smooth surface to produce a lower emissivity of said metal layer.

In a further aspect of the present invention, said substrate consists of a stretchable tightly woven textile consisting of fibres of between 5-80 denier as to allow a smooth surface to apply said metal layer and produce a low emissivity. Said textile could be produced from natural or synthetic fibres or blend thereof. In a preferred embodiment said textile is compressed through a series of hot rollers in a cire process before or after metalisation to produce a more smooth surface to produce a lower emissivity of said metal layer.

In a preferred embodiment of the present invention, the said metal layer(s) can feature an organic or inorganic coating to protect it from moisture and oxidisation. Preferably, a thin organic or inorganic coating layer is also deposited on the surface of the substrate between the substrate layer and the metal coating layer to effectively encapsulate the metal layer and further protect it from moisture and oxidisation. Said organic or inorganic layers can have functionalization useful in the application, such as oliophobic, hydrophobic, UV absorbing, antibacterial polymerisation and the like. The coatings are preferably formed under vacuum using vapor deposition techniques under conditions that substantially coat the substrate without significantly reducing its moisture vapor permeability.

In a further embodiment of the present invention, the said organic or in-organic coatings comprise one or more functional components. Functionalities include hydrophilic coatings from monomers functonalised with groups including hydroxyl, carboxyl, sulphonic, amino, amido and ether. Hydrophobic coatings from monomers with hydrofluoric functional groups and/or monomers that create nanostructure on the textile surface. Antimicrobial coatings from a monomer with antimicrobial functional groups and/or encapsulated antimicrobial agents (including chlorinated aromatic compounds and naturally occurring antimicrobials). Fire retardant coatings from monomers with a brominated functional group. Self cleaning coatings from monomers and/or sol gels that have photo-catalytically active chemicals present (including zinc oxide, titanium dioxide, tungsten dioxide and other metal oxides). Ultraviolet protective coating from monomers and/or sol-gels that contain UV absorbing agents (including highly conjugated organic compounds and metal oxide compounds).

According to one aspect the present invention, the metal and organic or in-organic coating layers are deposited on said substrate using methods that do not substantially reduce the moisture vapor permeability of the substrate. The metal and organic or in-organic coating layers are deposited via a vacuum vapour deposition method, this provides a coated composite substrate that has a moisture vapor permeability that is at least about 80%, even at least about 85%, and even at least about 90% of the moisture vapor permeability of the starting substrate material. Vacuum vapor deposition methods known in the art are preferred for depositing the metal and organic or in-organic coatings. The thickness of the metal and organic or in-organic coatings are preferably controlled within ranges that provide a composite substrate having an emissivity no greater about 0.35. In a preferred embodiment the said substrate is pre-treated by plasma in a vacuum or at atmospheric pressure to improve adhesion of said metal and/or organic and/or inorganic layers.

In embodiment of the present invention the said metal layer(s) are deposited on said substrate by means of vacuum vapour deposition in one or multiple coating layers to achieve the desired thickness of said metal layer to provide optimal reflection of infra-red radiation. Said multiple coating layers may be deposited in the same process in a single vacuum chamber or in multiple processes in the same or different vacuum chambers. This method of vacuum deposition includes a step of flash evaporation in some embodiments. In some embodiments, the surface of the substrate is treated with plasma prior to the step of vacuum depositing of the metal layer. The vacuum depositing step is performed two or more times in some embodiments to make two or more coatings of metal to achieve a thickness of the metal layer of between about 10 nm and about 200 nm.

In another embodiment of the present invention, said substrate is degassed to reduce the water and/or solvent content before coating via vacuum vapour deposition by a process including winding said substrate on a heated drum. Said degassing process is preferably undertaken within a vacuum to allow sufficient degassing at a temperature of between 40-80° C. whereby the lower degassing temperature prevents thermal damage to said substrate. Additional degassing and drying processes maybe also be required at higher temperature to remove other solvents present in said substrate from the manufacturing process. In one preferred embodiment where said substrate is a Polyurethane film, said substrate is pre-dried at a temperature above 120° C. to remove Dimethylformamide and/or other solvents.

In another embodiment of the present invention, said substrate is coated via vacuum vapour deposition using an additional support substrate to provide stability and ease of handling during said coating process.

According to another aspect of the present invention, said metal layer may be produced by means of coating the substrate with a thin metallic film by means of sputtering, rotary screen printing, block screen printing, transfer printing, jet printing, spraying, sculptured roller or other methods.

In another aspect of the present invention, said metal layer is applied to said substrate by means of a transfer metallization process whereby a thin metal film or foil is coated onto a release substrate such as paper sheet, polypropylene sheet, polyester sheet or other material via vacuum vapour deposition or other method and then adhered onto said substrate.

In a further aspect to the present invention, said metal layer may be applied to said substrate in a continuous or discontinuous pattern whereby said metal layer covers the entire surface of the said substrate or part of the surface of said substrate. Such a continuous or non-continuous metal layer is typically in the form of a film that is adhered to the surface of the substrate.

Moisture vapor permeable monolithic (non-porous) films are formed from a polymeric material that can be extruded as a thin, continuous, moisture vapor permeable, and substantially liquid impermeable film. The film layer can be extruded directly onto a first nonwoven, woven or knitted layer using conventional extrusion coating methods. Preferably, the monolithic film is no greater than about 3 mil (76 micrometers) thick, even no greater than about 1 mil (25 micrometers) thick, even no greater than about 0.75 mil (19 micrometers) thick, and even no greater than about 0.60 mil (15.2 micrometers) thick. In an extrusion coating process, the extruded layer and substrate layer are generally passed through a nip formed between two rolls (heated or unheated), generally before complete solidification of the film layer, in order to improve the bonding between the layers. A second nonwoven, woven or knitted layer can be introduced into the nip on the side of the film opposite the first substrate to form a moisture vapor permeable, substantially air impermeable laminate wherein the monolithic film is sandwiched between the two textile layers.

Polymeric materials suitable for forming moisture vapor permeable monolithic films include block polyether copolymers such as a block polyether ester copolymers, polyetheramide copolymers, polyurethane copolymers, poly(etherimide) ester copolymers, polyvinyl alcohols, or a combination thereof. Preferred copolyether ester block copolymers are segmented elastomers having soft polyether segments and hard polyester segments, as disclosed in Hagman, U.S. Pat. No. 4,739,012 that is hereby incorporated by reference. Suitable copolyether ester block copolymers include Hytrel® copolyether ester block copolymers sold by E. I. du Pont de Nemours and Company (Wilmington, Del.), and Arnitel® polyether-ester copolymers manufactured by DSM Engineering Plastics, (Heerlen, Netherlands). Suitable copolyether amide polymers are copolyamides available under the name Pebax® from Atochem Inc. of Glen Rock, N.J., USA. Pebax® is a registered trademark of Elf Atochem, S.A. of Paris, France. Suitable polyurethanes are thermoplastic urethanes available under the name Estane® from The B. F. Goodrich Company of Cleveland, Ohio, USA. Suitable copoly(etherimide) esters are described in Hoeschele et al., U.S. Pat. No. 4,868,062. The monolithic film layer can be comprised of multiple layers moisture vapor permeable film layers. Such a film may be co-extruded with layers comprised of one or more of the above-described breathable thermoplastic film materials.

A moisture vapour permeable and substantially liquid impermeable substrate is also achieved using a microporous film or coating, in some embodiments.

The thickness and the composition of the outer organic or in-organic coating layer is selected such that, in addition to not substantially changing the moisture vapor permeability of the substrate layer, it does not significantly increase the emissivity of the metalized substrate. The outer organic or in-organic coating layer preferably has a thickness between about 0.2 µm and 2.5 µm, which corresponds to between about 0.15 g/m$^2$ to 1.9 g/m$^2$ of the coating material. In one embodiment, the outer coating layer has a thickness between about 0.2 µm and 1.0 µm (about 0.15 g/m$^2$ to 0.76 g/m$^2$), or between about 0.2 µm and 0.6 µm (about 0.15 g/m$^2$ to 0.46 g/m$^2$). The combined thickness of the intermediate and outer organic or in-organic layers is preferably no greater than about 2.5 µm, even no greater than about 2.0 µm, even no greater than about 1.5 µm. In one embodiment, the combined thickness of the intermediate and outer organic or in-organic coating layers is no greater than about 1.0 µm. In one embodiment, the intermediate coating layer has a thickness between about 0.02 µm and 1 µm (0.015 g/m$^2$ and 0.76 g/m$^2$), or between about 0.02 µm and 0.6 µm (0.015 g/m$^2$ and 0.46 g/m$^2$). When additional metal and organic or in-organic layers are deposited, the thickness of each organic or in-organic coating layer is adjusted such that the total combined thickness of all the organic or in-organic coating layers is no greater than about 2.5 µm, or no greater than about 1.0 µm. If the outer organic or in-organic coating layer is too thin, it may not protect the metal layer from oxidation, resulting in an increase in emissivity of the composite substrate. If the outer organic or in-organic coating layer is too thick, the emissivity of the composite substrate can increase, resulting in lower thermal barrier properties.

Suitable compositions for the organic coating layer(s) include polyacrylate polymers and oligomers. The coating material can be a cross-linked compound or composition. Precursor compounds suitable for preparing the organic coating layers include vacuum compatible monomers, oligomers or low MW polymers and combinations thereof. Vacuum compatible monomers, oligomers or low MW polymers should have high enough vapor pressure to evaporate rapidly in the evaporator without undergoing thermal degradation or polymerization, and at the same time should not have a vapor pressure so high as to overwhelm the vacuum system. The ease of evaporation depends on the molecular weight and the intermolecular forces between the monomers, oligomers or polymers. Typically, vacuum compatible monomers, oligomers and low MW polymers useful in this invention can have weight average molecular weights up to approximately 1200. Vacuum compatible monomers used in this invention are preferably radiation polymerizable, either alone or with the aid of a photoinitiator, and include acrylate monomers functionalized with hydroxyl, ether, carboxylic acid, sulfonic acid, ester, amine and other functionalities. The coating material may be a hydrophobic compound or composition. The coating material may be a crosslinkable, hydrophobic and oleophobic fluorinated acrylate polymer or oligomer, according to one preferred embodiment of the invention. Vacuum compatible oligomers or low molecular weight polymers include diacrylates, triacrylates and higher molecular weight acrylates functionalized as described above, aliphatic, alicyclic or aromatic oligomers or polymers and fluorinated acrylate oligomers or polymers. Fluorinated acrylates, which exhibit very low intermolecular interactions, useful in this invention can have weight average molecular weights up to approximately 6000. Preferred acrylates have at least one double bond, and preferably at least two double bonds within the molecule, to provide high-speed polymerization. Examples of acrylates that are useful in the coating of the present invention and average molecular weights of the acrylates are described in U.S. Pat. No. 6,083,628 and WO 98/18852.

Suitable compositions for the in-organic coating layers include metal oxide components including but not limited to Silicone dioxide, titanium dioxide, tungsten dioxide, zinc oxide. Inorganic coating layer(s) can be made by the sol-gel process of depositing a partially reacted metal alkoxide onto the substrate in the presence of water and an alcohol. The layer can also be produced from the deposition of a metal chloride solution. After application layers may be reduced in thickness by dry or moist heat treatment. The most effective method for deposition of metal alkoxide or metal chloride solutions onto the substrate is by flash evaporation and deposition in a vacuum environment.

Metals suitable for forming the metal layer(s) of the composites of the present invention include aluminum, gold, silver, zinc, tin, lead, copper, titanium and their alloys. The metal alloys can include other metals, so long as the alloy composition provides a low emissivity composite substrate. Each metal layer has a thickness between about 15 nm and 200 nm, or between about 30 nm and 60 nm. In one embodiment, the metal layer comprises aluminum having a thickness between about 15 and 150 nm, or between about 30 and 60 nm. In other embodiments, the metal layer comprises a silver precipitate with antibacterial properties. Methods for forming the metal layer are known in the art and include resistive evaporation, electron beam metal vapor deposition, or sputtering. If the metal layer is too thin, the desired thermal barrier properties will not be achieved. If the metal layer is too thick, it can crack and flake off and also reduce the moisture vapour permeability of the composite. Generally it is preferred to use the lowest metal thickness that will provide the desired thermal barrier properties. When the composite of the present invention is used in a garment the metal layer reflects infrared radiation providing a radiant thermal barrier that reduces energy loss and keeps the person wearing the garment warmer.

The thermal barrier properties of a material can be characterized by its emissivity. Emissivity is the ratio of the power per unit area radiated by a surface to that radiated by a black body at the same temperature. A black body therefore has an emissivity of one and a perfect reflector has an emissivity of zero. The lower the emissivity, the higher the thermal barrier properties. Each metal layer, intermediate organic coating and adjacent outer organic coating layer is preferably deposited sequentially under vacuum without exposure to air or oxygen so that there is no substantial oxidation of the metal layer. Polished aluminum has an emissivity between 0.039-0.057, silver between 0.020 and 0.032, and gold between 0.018 and 0.035. A layer of uncoated aluminum generally forms a thin aluminum oxide layer on its surface upon exposure to air and moisture. The thickness of the oxide film increases for a period of several hours with continued exposure to air, after which the oxide layer reaches a thickness that prevents or significantly hinders contact of oxygen with the metal layer, reducing further oxidation. Oxidized aluminum has an emissivity between about 0.20-0.31. By minimizing the degree of oxidation of the aluminum by depositing the outer organic coating layer prior to exposing the aluminum layer to the atmosphere, the emissivity of the composite substrate is significantly improved compared to an unprotected layer of aluminum. The outer organic coating layer also protects the metal from mechanical abrasion during roll handling, garment production and end-use.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Although the present invention has been described with particular reference to certain preferred embodiments thereof, variations and modifications of the present invention can be effected within the spirit and scope of the following claims.

What is claimed is:

1. A reflective composite, comprising:
   a first substrate comprising a woven textile, stretch woven textile, or knitted textile having fibers of between 5 to 80 denier and being a moisture vapor permeable substrate;
   a first metal layer coupled with a surface of the first substrate, such that the metal layer substantially conforms to the shape of the surface of the first substrate and having a thickness of between 10 nm and 200 nm with an oxidation layer formed at a surface of the first metal layer;
   a second substrate;
   a protective layer coupled to the first metal layer with the oxidation layer and is moisture vapor permeable;
   a first insulation layer disposed between the first substrate and the second substrate, wherein the protective layer is in direct contact with the first insulation layer such that the first metal layer is spaced from the first insulation layer by the protective layer; and
   the first insulation layer and the protective layer are both disposed between the second substrate and the first substrate, the first insulation layer comprising air gaps, such that the first metal layer is provided exposure through the first insulation layer; and having a thermal resistance of between 0.05 m²K/W and 0.5 m²K/W.

2. The reflective composite of claim 1, wherein the protective layer comprises at least one of an organic protective coating and an inorganic protective coating.

3. The reflective composite of claim 1, wherein the coupling of the metal layer to the first substrate and the protective layer limits formation of the oxidation layer.

4. The reflective composite of claim 1, wherein the metal layer with the oxidation layer has an emissivity of between 0.31 to 0.2.

5. The refective composite of claim 1, wherein the first metal layer has a thermal resistance of between 0.0 m²K/W and 0.03 m²K/W.

6. The reflective composite of claim 1, wherein the metal layer is aluminum.

7. The reflective composite of claim 1, wherein the first metal is applied to the first substrate by vacuum deposition.

8. The reflective composite of claim 1, wherein the first insulation layer is selected from the group of: natural down, natural feather, natural fibre, synthetic feather, synthetic down, and synthetic fibre.

9. The reflective composite of claim 1, wherein the air gaps of the first insulation layer are in the form of at least one of the following: spacing between fibers of the first insulation layer, perforations through the first insulation layer, and cavities in the first insulation layer facing the protective layer.

10. The reflective composite of claim 1, wherein, due to the air gaps of the first insulation layer, less than fifty percent of the surface of the protective layer is in direct contact with the first insulation layer.

11. The reflective composite of claim 1, wherein the second substrate is a vapor permeable substrate.

12. The reflective composite of claim 1, wherein the second substrate comprises a woven textile, stretch woven textile, or knitted textile having fibers of between 5 to 80 denier.

13. The reflective composite of claim 1, further comprising:
   a second metal layer applied to a surface of the second substrate facing the first substrate.

14. The reflective composite of claim 1, further comprising:
   a second protective layer applied to the second substrate.

15. The reflective composite of claim 1, further comprising:
   a third substrate; and
   a second insulation layer, wherein the second insulation layer is disposed between the third substrate and the first substrate.

16. The reflective composite of claim 15 wherein the second insulation layer is selected from at least one of: synthetic fibres, natural fibres, synthetic down, natural down, synthetic feathers, and natural feathers, and the insulation layer has a thermal resistance of between 0.05 m²K/W and 0.5 m²K/W.

17. The reflective composite of claim 15, further comprising:
   a second metal layer applied to a surface of the first substrate opposite the surface having the first metal layer coupled thereto or a surface of the second substrate facing the first substrate.

18. The reflective composite of claim 15, further comprising:

a second metal layer applied to a surface of the first substrate opposite the surface having the first metal layer coupled thereto;

a third metal layer applied to a surface of the second substrate facing the first substrate; and a fourth metal layer applied to a surface of the third substrate facing the first substrate.

19. The reflective composite of claim 6, further comprising:

a fourth substrate; and a third insulation layer, wherein the third insulation layer is disposed between the third substrate and the fourth substrate.

20. The reflective composite of claim 19, further comprising:

a second metal layer applied to a surface of the third substrate facing the first substrate; and a third metal layer applied to a surface of the fourth substrate facing the third substrate.

* * * * *